US007659718B1

(12) United States Patent
Lustig et al.

(10) Patent No.: US 7,659,718 B1
(45) Date of Patent: Feb. 9, 2010

(54) BLIP DESIGN FOR RANDOM SAMPLING COMPRESSED SENSING OF FLYBACK 3D-MRSI

(75) Inventors: Michael Lustig, Stanford, CA (US); Zhong-Min Hu, McKinleyville, CA (US); Daniel B. Vigneron, Corte Madera, CA (US); John M. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 58 days.

(21) Appl. No.: 12/183,391

(22) Filed: Jul. 31, 2008

(51) Int. Cl.
*G01V 3/00* (2006.01)
(52) U.S. Cl. .................. 324/309; 324/307
(58) Field of Classification Search ......... 324/300–322; 600/407–435; 382/194; 702/194, 188, 193, 702/69
See application file for complete search history.

(56) References Cited

U.S. PATENT DOCUMENTS

| 7,425,828 B2 * | 9/2008 | Garwood et al. ............ 324/310 |
| 2003/0049867 A1 * | 3/2003 | Selifonov et al. ........... 436/518 |
| 2006/0029279 A1 * | 2/2006 | Donoho ..................... 382/232 |
| 2008/0197842 A1 | 8/2008 | Lustig et al. |

OTHER PUBLICATIONS

Cunningham et al., "Double spin-echo sequence for rapid spectroscopic imaging of hyperpolarized 13C," J. Magn Reson 187 (2007) 357-362.

Candes E, Romberg JK, "Practical Signal recovery from random projections," Proceedings of the SPIE, vol. 5674, pp. 76-86 (2005).

Duyn et al., "Simple correction method for kspace trajectory deviations in MRI," J Jagn Reson 132 1998 150-153.

Kerr et al., "Gradient Measurement and Characterization for Spiral and Echo-Planar Sequences," Proceedings of the International Society of Magnetic Resonance in Medicine, 4th Annual Meeting, New York, 1996, p. 364.

Zhao et al., "Gradient-echo imaging considerations for hyperpolarized 129Xe MR," J Magn Reson Series B 113 (1996) 179-183.

Cunningham et al., "Design of flyback echo-planar readout gradients for magnetic resonance spectroscopic imaging," Magn Reson Med 54 (2005) 1286-1289.

Lustig et al., "Sparse MRI: The Application of Compressed sensing for Rapid MR Imaging," Magnetic Resonance in Medicine, 58:1182-1195, 2007.

Hu et al., "Compressed Sensing for Resolution Enhancement of Hyperpolarized 13C Flyback 3D-MRSI," Journal of Magnetic Resonance, 2008;192(2), pp. 258-264.

* cited by examiner

*Primary Examiner*—Brij B Shrivastav
(74) *Attorney, Agent, or Firm*—Beyer Law Group LLP (57) ABSTRACT

A method of providing a magnetic resonance spectral image (MRSI) is provided. A magnetic resonance imaging excitation is applied. Data is acquired, comprising applying an oscillating gradient in a first dimension and applying blips in at least a second dimension in a pseudo-random order to acquire pseudo-random temporally undersampled spectral data in at least two planes. The pseudo-random order is used to reconstruct a magnetic resonance spectral image in at least two dimensions.

17 Claims, 10 Drawing Sheets

BLIP DESIGN FOR RANDOM SAMPLING COMPRESSED SENSING OF FLYBACK 3D-MRSI

STATEMENT REGARDING FEDERALLY SPONSORED RESEARCH OR DEVELOPMENT

The U.S. Government has rights in the disclosed invention pursuant to NIH RO1 EB007588 to Vigneron with a subcontract to Stanford University.

BACKGROUND OF THE INVENTION

This invention relates generally to magnetic resonance imaging (MRI).

Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, mutation about an axis perpendicular to the main field, and both transverse and longitudinal relaxation. In steady-state MRI experiments, a combination of these effects occurs periodically.

SUMMARY

In accordance with the invention, a method of providing a magnetic resonance spectral image (MRSI) is provided. A magnetic resonance imaging excitation is applied. Data is acquired, comprising applying an oscillating gradient in a first dimension and applying blips in at least a second dimension in a pseudo-random order to acquire pseudo-random temporally undersampled spectral data in at least two planes. The pseudo-random order is used to reconstruct a magnetic resonance spectral image in at least two dimensions.

In another manifestation of the invention an apparatus for providing a magnetic resonance spectral imaging (MRSI) is provided. A magnetic resonance imaging excitation and detection system is provided. A controller is electrically connected to the magnetic resonance imaging excitation and detection system and comprises a display, at least one processor, and computer readable media. The computer readable media comprises computer readable code for applying a magnetic resonance imaging excitation, computer readable code for acquiring data, comprising computer readable code for applying an oscillating gradient in a first dimension and computer readable code for applying blips in at least a second dimension in a pseudo-random order to acquire pseudo-random temporally undersampled spectral data in at least two planes, computer readable code for using the pseudo-random order to reconstruct a magnetic resonance spectral image in at least two dimensions, and computer readable code for displaying the image on the display.

The invention and objects and features thereof will be more readily apparent from the following detailed description and appended claims when taken with the drawings.

DETAILED DESCRIPTION OF ILLUSTRATIVE EMBODIMENTS

High polarization of nuclear spins in liquid state through dynamic nuclear polarization has enabled the direct monitoring of $^{13}$C metabolites in-vivo at very high signal to noise, allowing for rapid assessment of tissue metabolism. The abundant SNR afforded by this hyperpolarization technique makes high resolution $^{13}$C 3D-MRSI feasible. However, the number of phase encodes that can be fit into the short acquisition time for hyperpolarized imaging, currently limits the spatial resolution. To take advantage of the high SNR available from hyperpolarization, an embodiment of the invention applies compressed sensing to achieve higher spatial resolution without increasing acquisition time. In an embodiment of the invention, the design and testing of compressed sensing suited for a flyback $^{13}$C 3D-MRSI sequence are presented. The key to this design was the undersampling of spectral k-space using a novel blipped scheme, thus taking advantage of the considerable sparsity in typical hyperpolarized $^{13}$C spectra. Phantom tests validated the accuracy of the compressed sensing approach and initial mouse experiments demonstrated in-vivo feasibility.

Introduction

Carbon-13 spectroscopy has traditionally been limited by low signal strength. With the development of techniques to maintain hyperpolarization of carbon-13 in liquid state, it has become possible to use $^{13}$C substrates (tracers) for medical imaging. More recent studies have used the metabolically active substrate [I-$^{13}$C]pyruvate to examine its conversion to [I-$^{13}$C]lactate, [I-$^{13}$C]alanine, and $^{13}$C-bicarbonate. Spectroscopic examination of this metabolic pathway in the presence and absence of disease has enormous diagnostic potential. Specifically, it has been shown that the levels of $^{13}$C metabolic products differ between disease and non-disease states in a mouse model of prostate cancer. A partial voluming may complicate the interpretation of non-disease spectra because of the small size of the normal mouse prostate. With the abundant SNR available in hyperpolarized studies, it would be beneficial to sacrifice some signal for improved spatial resolution.

Theory

Pulse Sequence: The pulse sequence used in this embodiment of the invention builds on the one diagrammed in FIG. 1, which is a double spin-echo sequence with flyback readout. A spin-echo sequence is desired in order to mitigate the effects of $B_0$ inhomogeneity and allow for a full echo acquisition. Owing to its insensitivity to transmit gain, this double adiabatic sequence outperforms a conventional spin-echo sequence in preserving hyperpolarization over the many excitations needed for the phase encodes in a 3D-MRSI acquisition, as explained in C. H. Cunningham, A. P. Chen, M. J. Albers, J. Kurhanewicz, R. E. Hurd, Y. Yen, J. M. Pauly, S. J. Nelson, D. B. Vigneron, "Double spin-echo sequence for rapid spectroscopic imaging of hyperpolarized $^{13}C$," J. Magn. Reson. 187 (2007) 357-362, which is incorporated by reference for all purposes. Ultimately, this sequence reads out a rectilinear k-space trajectory, with a typical result being 59×8×8×16 ($k_f$-$k_x$-$k_y$-$k_z$) 4D k-space data.

Compressed sensing is believed to perfectly reconstruct sparse signals of length N from a subset of samples. For example, suppose a length N discrete signal f consists of M non-zero points. Then, with extremely high probability, f can be recovered exactly from K Fourier measurements where 1. $K \geq \text{Const} \cdot M \log N$ and the solution is found by solving the convex minimization problem $$2. \min \sum_n |g[n]| \ \bigg| \ s.t. \ F_k\{g[n]\} = y \quad (2)$$

where y are the K measured Fourier coefficients. In other words, Eq. (2) states that for all reconstructions g[n] whose Fourier coefficients match those at the K measured positions, the unique and correct solution is the one that minimizes the absolute sum of g, i.e. the $L_1$ norm in the object domain. The theorems of compressed sensing are actually much more general than this concrete example suggests. In other words, the signal f only needs to be sparse in some domain, not necessarily the object domain, and the K measurements do not necessarily have to be Fourier measurements. From a practical standpoint, the application specific values for M, N, and the constant multiplier determine the feasibility of compressed sensing. Additionally, a real-world signal will never consist of just M non-zero points in any domain, but it will usually be well approximated by M sparse transform coefficients. For example, the fidelity with which compressed sensing reproduces an M-term wavelet approximation, i.e. the sparse domain being the wavelet domain, could serve as a benchmark for real-world signals. For various N=1024 test signals in Candés E, Romberg J K. Signal recovery from random projections. In Proceedings of SPIE Computational Imaging III, San Jose, 2005, p. 5674, which is incorporated by reference for all purposes, Candes empirically determined that for compressed sensing to match the accuracy of an M-term wavelet representation, K≈3M-5M measurements were required. As mentioned previously, for the actual implementation of compressed sensing, the K measurements must be collected with a sampling pattern that produces incoherent aliasing in the domain, such as the wavelet domain, where the signal shows sparsity. A random sampling pattern in k-space almost always meets this criterion.

3D-MRSI Signal: The most straightforward application of compressed sensing to hyperpolarized 3D-MRSI would be to undersample in $k_x$ and $k_y$. For example, to achieve 16×8 spatial resolution in the time of 8×8 phase encodes, i.e. a speedup factor of 2, one could simply collect 8×8 of the phase encodes in a conventional 16×8 scan (K=64, N=128). However, our wavelet simulations, along the lines of Candes' simulations, have shown that such a small N leads to a relatively large M and thus does not provide enough sparsity to exploit. A better strategy would be to attempt undersampling in the $k_f$ and $k_x$ dimensions, considering that typical hyperpolarized spectra are inherently sparse and N. As shown in the wavelet simulations of FIGS. 2A-C, such a signal exhibits considerable sparsity. (Note that wavelet transforms were chosen because they do a good job of sparsifying NMR spectra, though other choices are possible well.) The key point is that the majority of the sparsity occurs in the spectra and therefore the time domain should be undersampled. However, the implementation of time domain undersampling is not at all straightforward, as the next section demonstrates. A scheme to undersample in the time domain as well as in one spatial domain was developed, mainly exploiting spectral sparsity but some spatial sparsity as well.

Figure 2A:
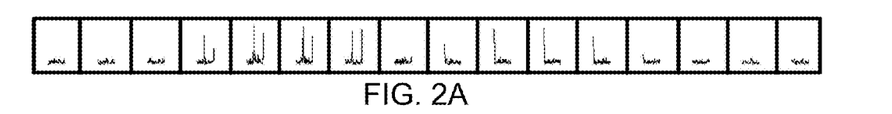
FIGS. 2A-C demonstrate wavelet compressibility of a $^{13}$C spectroscopic signal.
Figure 2B:
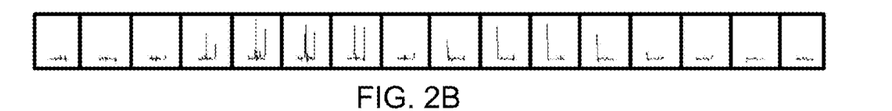
Figure 2C:
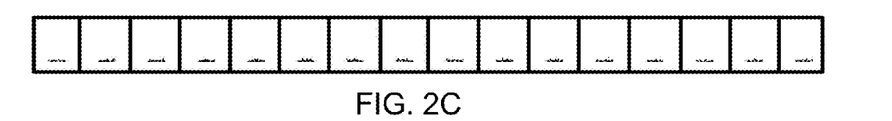

FIGS. 2A-C demonstrate wavelet compressibility of a $^{13}C$ spectroscopic signal. A row of magnitude spectra (64×16) from a 3D-MRSI phantom data set was taken as a test signal. The 59 spectral points from the 59 flyback lobes were zero-padded to 64, because the wavelet software used required dyadic numbers. FIG. 2A shows the 16 original spectra. FIG. 2B shows a 2D Daubechies wavelet transform applied to the 64×16 data, after which the top 10% wavelet coefficients were retained and the inverse 2D wavelet transform taken. FIG. 2C shows the magnitude error between the spectra of FIG. 2A and FIG. 2B. FIGS. 2A-C have the same y-axis scale. The 64×16 data were reconstructed very accurately from only 10% of their wavelet coefficients, showing that the signal of interest exhibits considerable fundamental sparsity.

Implementation of $k_f$-$k_x$ incoherent sampling: The key to implementing a k-space trajectory that randomly undersamples in $k_f$-$k_x$, lies in the random sampling of $k_f$=t using blips. FIG. 3 and FIGS. 4A-C illustrate a scheme that achieves $k_f$ sub sampling by hopping back and forth between adjacent $k_x$ lines during a flyback readout. In this manner, data from two $k_f$-$k_x$ lines are acquired during a single phase encode, in effect randomly undersampling in time. Thus, 16×8 resolution can be achieved in half the time by collecting 8×8 of the readouts in a conventional 16×8 scan. This approach is somewhat similar to a k-t sparse scheme, as described in U.S. patent application Ser. No. 12/029,583 filed on Feb. 12, 2008, entitled "K-T SPARSE: HIGH FRAME-RATE DYNAMIC MAGNETIC RESONANCE IMAGING EXPLOITING SPATIO-TEMPORAL SPARSITY," which is incorporated by reference for all purposes, but this embodiment applies gradients to move around in $k_f$ space instead of reordering phase encodes. This blipped scheme addresses the design challenge of generating sufficient incoherent aliasing through random undersampling, in other words meeting the second criterion for the successful application of compressed sensing. Without the blips, there would be too much structure to the undersampling, which would lead to coherent aliasing. To reiterate, the design in FIG. 3 achieves two-fold undersampling by jumping between two lines. A design to achieve three-fold undersampling would have to jump between 3 lines, and a design to achieve four-fold undersampling would have to jump between 4 lines. This embodiment uses the Duyn method described in H. Duyn, Y. Yang, J. A. Frank, J. W. van der Veen, "Simple correction method for kspace trajectory deviations in MRI," J. Magn. Reson. 132 (1998) 150-153 and A. Kerr, J. Pauly, D. Nishimura, "Eddy current characterization and compensation in spiral and echo-planar imaging," Proceedings of the International Society of Magnetic Resonance in Medicine, 1996, p. 364, which are both incorporated by reference for all purposes, to measure the actual k-space trajectory traced out by our blips. As expected, on a modern clinical scanner with eddy current compensation, the measured k-space closely matched the intended one. In other words, the blips have minimal side effects, and unintended k-space deviations were negligible.

Figure 1:
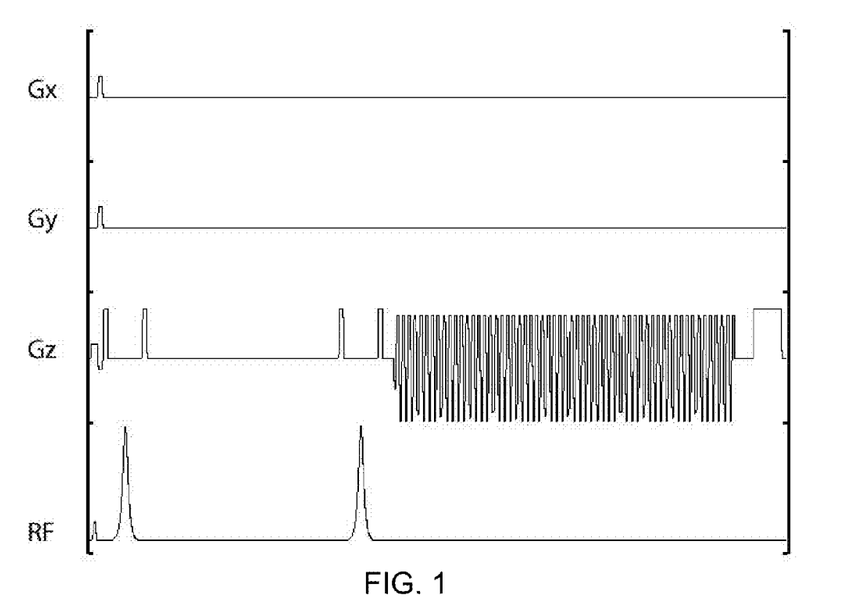
FIG. 1 shows a pulse sequence used in this embodiment of the invention.
Figure 3:
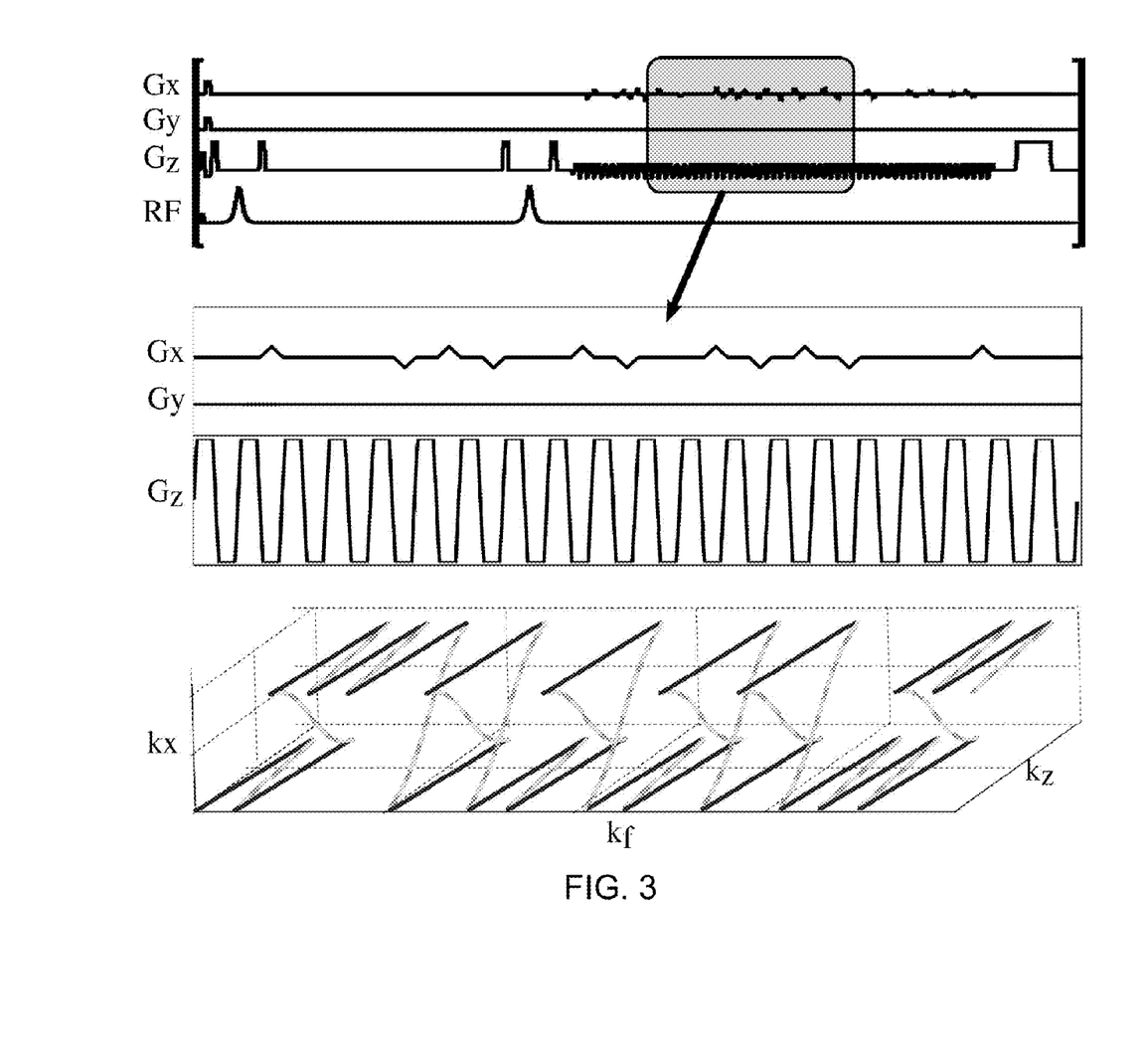
FIG. 3 shows a blipped scheme for $k_f$-$k_x$ sub-sampling.

FIG. 3 shows a blipped scheme for $k_f$-$k_x$ sub-sampling. The top graph shows a sequence where the only modification from the sequence of FIG. 1, is the addition of blips during the rewind portion of the flyback readout. The area of each blip is the area in a x-phase encode step. The bottom graph shows the associated order of the k-space readout. A single readout now covers two $k_f$-$k_x$ lines.

Figure 4A:
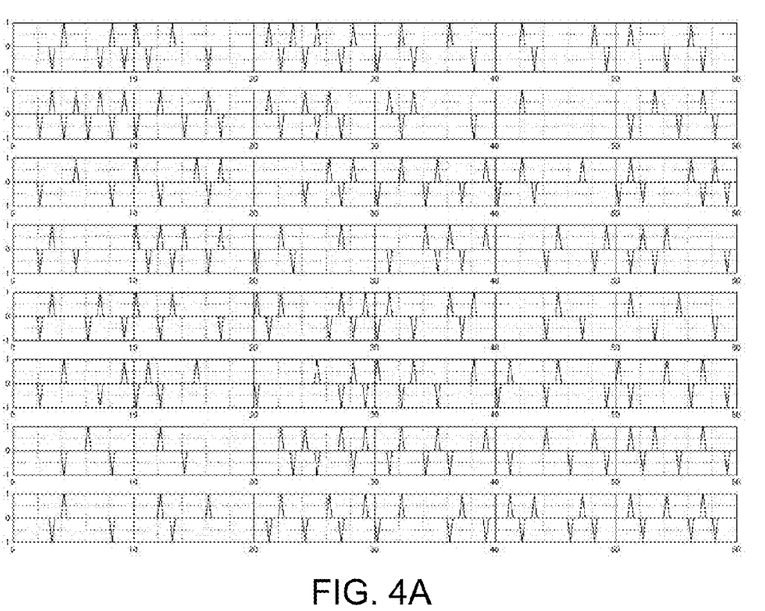
FIGS. 4A-C shows blipped patterns to cover 16 $k_f$-$k_x$ lines, resulting coverage, and point spread function.
Figure 4B:
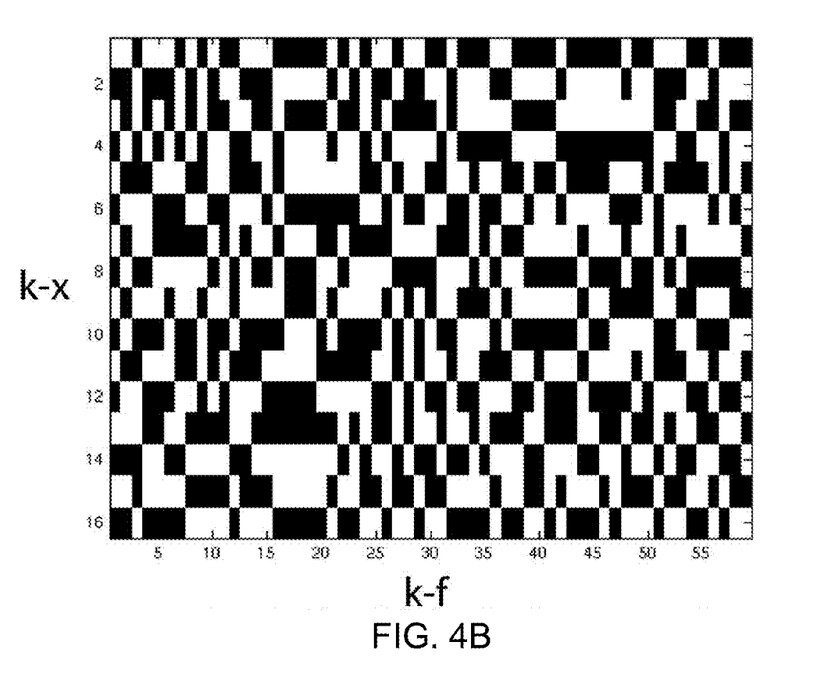
Figure 4C:
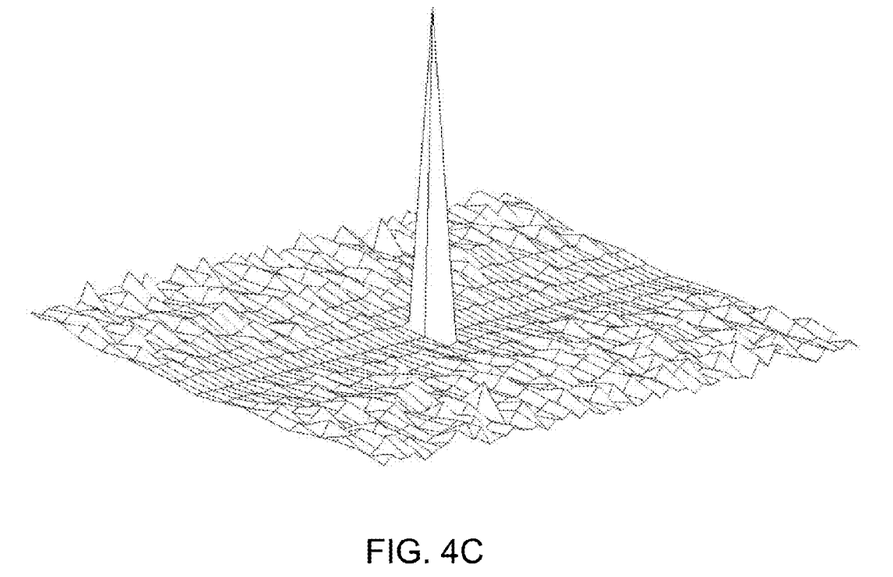

FIGS. 4A-C shows blipped patterns to cover 16 $k_f$-$k_x$ lines, resulting coverage, and point spread function. FIG. 4A illustrates actual 8 blipped patterns used to cover 16 $k_f$-$k_x$ lines in pseudo-random manner. The x-axis shows a blip number and the y-axis shows the polarity of each blip. FIG. 4B illustrates associated k-space sampling. Because twice as many k-space points are sampled in the time of 8 phase encodes, half of the 59×16 $k_f$-$k_x$ points are missing, where the missing points are indicated by the black regions. FIG. 4C illustrates the 2D point spread function of the pseudo-random pattern in FIG. 4B.

Experimental

Pulse Sequence and Hardware: Source code derived from C. H. Cunningham, A. P. Chen, M. J. Albers, J. Kurhanewicz, R. E. Hurd, Y. Yen, J. M. Pauly, S. J. Nelson, D. B. Vigneron, "Double spin-echo sequence for rapid spectroscopic imaging of hyperpolarized $^{13}$C," J. Magn. Reson. 187 (2007) 357-362, which is incorporated by reference for all purposes, originally a free induction decay (FID) MRSI sequence, was modified to incorporate triangular gradient blips designed in MATLAB™ (Mathworks Inc., Natick, Mass.). In an attempt to minimize eddy current effects, the blips were made 0.8 ms, relatively wide considering the distance between adjacent flat flyback portions was 1.16 ms. The amplitude of the blips was calculated by the source code, so that each blip's area equaled the area in a phase encode increment. A variable flip angle (VFA) scheme, as described in L. Zhao, R. Mulkern, C. Tseng, D. Williamson, S. Patz, R. Kraft, R. L. Walsworth, F. A. Jolesz, M. S. Albert, "Gradient-echo imaging considerations for hyperpolarized 129Xe MR," J. Magn. Reson. Series B 113 (1996) 179-183, which is incorporated by reference for all purposes, i.e. increasing flip angle over time to compensate for the loss in hyperpolarized signal, was used in the in-vivo experiments. The actual $n^{th}$ flip angle θ[n] precalculated by the source code for a given acquisition of N flips was as follows:

$$\theta[n] = \begin{cases} 90° & \text{if } n = N \\ \arctan(\sin(\theta[n+1])) & \text{if } n < N \end{cases} \quad (3)$$

For example, in one embodiment with N=8×8=64 readouts, θ[64]=90°, θ[63]=arctan(sin(90°))=45°, θ[62]=arctan(sin(45°))=35.3°, . . . θ[1]=7.2°. Calibration of the pulse angles was performed on the day of each study using a prescan of a corn oil phantom.

In addition, reordering of phase encodes to collect data near the k-space origin first was also employed. For all experiments, T2-weighted images were acquired with a fast spin-echo sequence, after which MRSI data, phase encode localized in x/y with flyback readout in the S/I direction z, were collected. All experiments were performed on a General Electric EXCITE 3T (Waukesha, Wis.) clinical scanner equipped with 40 mT/m, 150 mT/m/ms gradients and a broadband RF amplifier. Custom built, dual-tuned $^1$H/$^{13}$C transmit/receive coils were used for all phantom and animal experiments.

Reconstruction: For acquisitions without blipped gradients, the reconstruction procedure, carried out with custom MRSI software, was as follows: 1) sample the raw flyback data to obtain a 4D matrix of k-space data, 2) apodize each FID and apply a linear phase correction to the spectral samples as described in C. H. Cunningham, D. B. Vigneron, A. P. Chen, D. Xu, S. J. Nelson, R. E. Hurd, D. A. Kelley, J. M. Pauly, "Design of flyback echo-planar readout gradients for magnetic resonance spectroscopic imaging," Magn. Reson. Med. 54 (2005) 1286 1289, which is incorporated herein by reference for all purposes, to account for the tilted k-space trajectory characteristic of a flyback readout, and 3) perform a 4D Fourier transform with zero-padding of the spectra. For blipped acquisitions, the processing pipeline, specifically the first step, was modified in that the flyback sampling was performed in MATLAB and the k-space points missed by the blipped trajectory were iteratively filled in using a non-linear conjugate gradient implementation of a variant of Eq. (2).

The variant is the following:

1. Minimize $\|W g\|_1$ 2. s.t. $\|F_k g - y\|_2 < \epsilon$  (4)

Here g is the signal we wish to reconstruct, $F_k$ is a multi-dimensional Fourier transform evaluated on k pseudo random k-space points, y is the acquired signal, $\epsilon$ is a data fidelity parameter and W is a sparsifying transformation. W can be either the identity matrix, wavelet transform, spatial finite differences, discrete cosine transform or any transformation which results in a sparse representation of the signal g.

Specifically, after sampling the raw flyback data to obtain 4D k-space data, the fully sampled $k_y$ and $k_z$ dimensions were inverse Fourier transformed, the following algorithm was applied to each $k_f$-$k_x$ slice, and then the y and z dimensions were forward Fourier transformed:

Iterative Algorithm for $l^1$-Penalized Reconstruction

Inputs:
 y—k-space measurements
 $F_u$—undersampled Fourier operator associated with the measurements
 Ψ—sparsifying transform operator
 λ—a data consistency tuning constant Optional Parameters:
 TolGrad—stopping criteria by gradient magnitude (default $10^{-4}$)
 MaxIter—stopping criteria by number of iterations (default 100)
 α, β—line search parameters (defaults α=0.05, β=0.6)

Outputs:
 m—the numerical approximation to Eq. 5, which is:

$$\underset{m}{\operatorname{argmin}} \|F_u m - y\|_2^2 + \lambda \|\Psi m\|_1 \quad (5)$$

```
% Initialization
k=0; m=0; g_0=∇f(m_0); Δm_0=-g_0
% Iterations
while (||g_k||_2<TolGrad or k>maxIter){
% Backtracking line-search
t=1; while (f(m_k+tΔm_k)>f(m_k)+αt·Real (g_k*Δm_k)) {t=βt}
m_{k+1}=m_k+tΔm_k
g_{k+1}=∇f(m_{k+1})
```

$$\gamma = \frac{\|g_{k+1}\|_2^2}{\|g_k\|_2^2}$$

```
Δm_{k+1}=-g_{k+1}+γΔm_k
k=k+1}
```

The conjugate gradient requires the computation of ∇f(m) which is, $$\nabla f(m) = 2F_u^*(F_u m - y) + \lambda \nabla \|\Psi m\|_1 \quad (6)$$

The $l^1$ norm is the sum of absolute values. The absolute value function however, is not a smooth function and as a result Eq. 6 is not well defined for all values of m. Instead, we approximate the absolute value with a smooth function by using the relation $|x| \approx \sqrt{x^*x + \mu}$, where μ is a positive smoothing parameter. With this approximation, $$\frac{d|x|}{dx} \approx \frac{x}{\sqrt{x^*x + \mu}}.$$

Now, let W be a diagonal matrix with the diagonal elements $w_i = \sqrt{(\Psi m)_i^*(\Psi m)_i + \mu}$. Equation 6 can be approximated by, $$\nabla f(m) \approx 2F_u^*(F_u m - y) + \lambda \Psi^* W^{-1} \Psi m \quad (7)$$

In practice, Eq. 7 is used with a smoothing factor $\mu \epsilon [10^{-15}, 10^{-6}]$. The number of CG iterations varies with different objects, problem size, accuracy and undersampling. Examples in this specification required between 80 and 200 CG iterations.

Phantom: Experiments on a cylindrical phantom containing $^{13}$C-labeled pyruvate/pyruvate-H$_2$O, lactate, and alanine in three respective inner spheres, were performed to verify the accuracy of the compressed sensing reconstruction. For both unblipped and blipped acquisitions, a flip angle of 10 degrees, TE=140 ms, TR=2 seconds, FOV=8×8 cm, and 16×8 resolution were used. The 16×8 unblipped acquisition with the standard reconstruction served as the gold standard. For the 16×8 blipped acquisition, acquired in half the time, the modified processing pipeline as discussed in the previous section was used. The sparsifying transform was a 1D length-4 Daubechies wavelet transform in the spectral dimension, meaning the algorithm presumed sparsity of the spectral peaks and tried to minimize the $L_1$ norm of a wavelet transform of the $k_f$ data. In addition, a total variation (TV) penalty was added to promote sparsity of finite differences. The weights given to the wavelet transform and TV penalty, and thus the amount of denoising and data fidelity, were selected manually with minimal optimization, and the same weights were used for subsequent animal experiments.

Mouse: For the in-vivo experiment, a prototype DNP polarizer developed and constructed by GE Healthcare (Malmö, Sweden) was used to achieve ~23% liquid state polarization of [1-$^{13}$C]pyruvate. The polarization was measured by extracting a small aliquot of the dissolved solution and measuring its FID intensity with a custom low-field spectrometer. ~300 μL (~80 mM) samples were injected into a surgically placed jugular vein catheter of a 39 g Transgenic Adenocarcinoma of Mouse Prostate (TRAMP) mouse within ~20s of dissolution. This particular TRAMP mouse had a large prostate tumor with many relatively homogenous tumor voxels across the FOV, making quantitative comparisons easier. Two runs were done (~2 hours apart), once for an unblipped 59×8×8×16 standard acquisition and again for a blipped 59×16×8×16 compressed sensing acquisition. The acquisition parameters for both runs were TE=140 ms, TR=215 ms (total acquisition time of 14 seconds), variable flip angle activated, reordered phase encodes, and FOV=4×4 cm. The blipped acquisition, using 8×8 of the readouts from a conventional 16×8 scan, was acquired after the unblipped one. All animal studies were carried out under a protocol approved by the UCSF Institutional Animal Care and Use Committee.

Results and Discussion

Figure 5A:
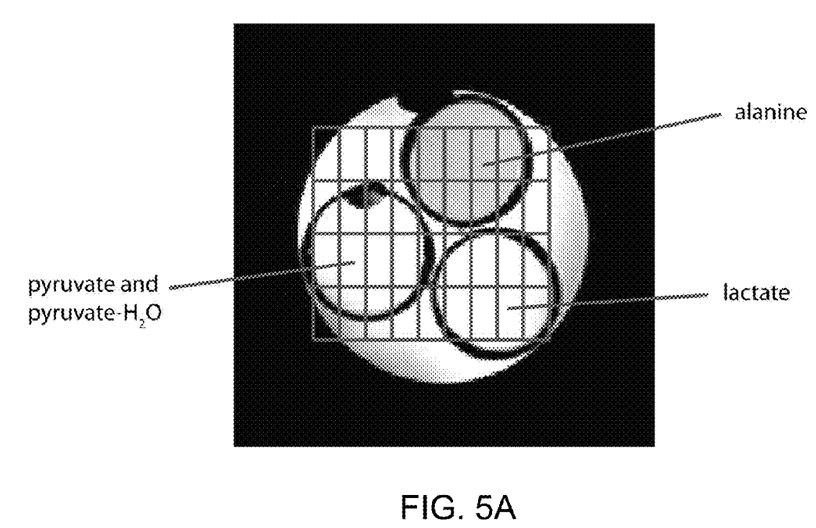
FIGS. 5A-C show a side-by-side comparison of a slice of final processed spectra from the 16×8 unblipped and blipped acquisitions.
Figure 5B:
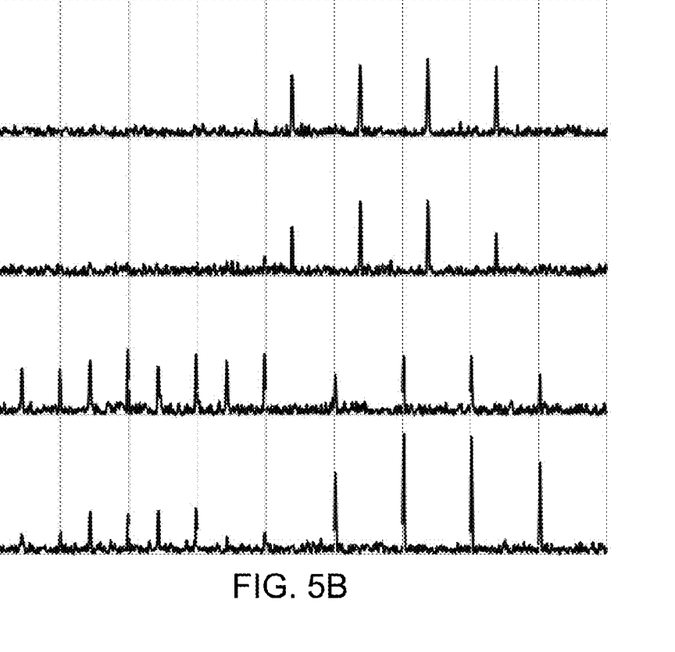
Figure 5C:
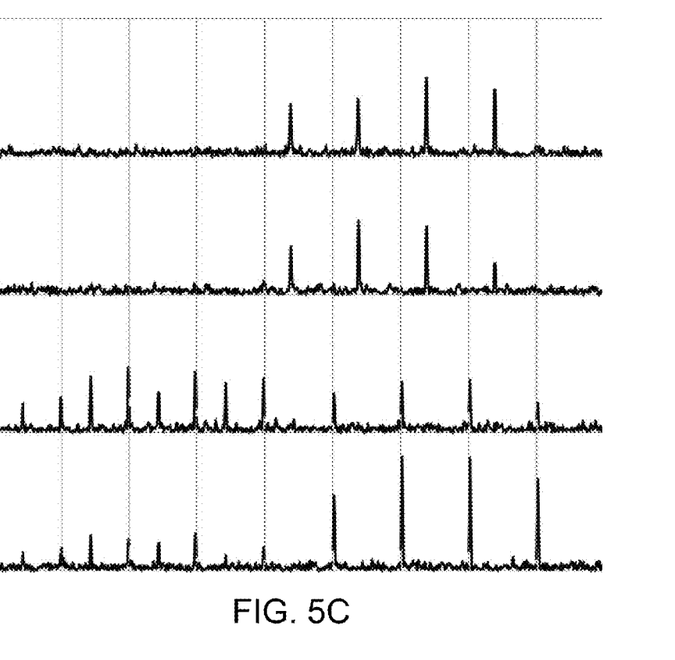

Phantom: FIGS. 5A-C show a side-by-side comparison of a slice of final processed spectra from the 16×8 unblipped and blipped acquisitions, with the blipped acquisition taken immediately after the unblipped one, to provide a comparison between normal and undersampled methods. FIG. 5A shows a T2-weighted image of a $^{13}$C phantom done before spectral acquisitions. FIG. 5B shows spectra from a normal, unblipped acquisition corresponding to highlighted voxels from FIG. 5A. FIG. 5C shows spectra from compressed sensing reconstructed, blipped acquisition corresponding to highlighted voxels from FIG. 5A.

Qualitatively, the spectra match up extremely well. Table 1 gives a quantitative comparison of the two reconstructions, listing SNR and metabolite peak ratios. Because biological conclusions typically drawn from final processed spectra, SNR was calculated with the magnitude spectra after apodization and zero-padding. Typically, halving the scan time, as was done for the blipped acquisition, would reduce SNR by a factor of square root of 2. Due to the denoising properties of the compressed sensing reconstruction combined with apodization, the SNR did not drop. The metabolite peak heights used for the ratio calculations were average peak heights over voxels with little or no partial voluming (n=4 for each metabolite). The metabolite ratios for the two data sets were similar, suggesting compressed sensing could be compatible with metabolite quantitation. Of course, a larger sample size is needed to confirm that the difference in quantitation with and without compressed sensing is statistically insignificant. Finally, note that the compressed sensing SNR is controllable in the sense that merely adjusting the $L_1$ denoising parameters in the reconstruction would lead to higher SNR. However, too much denoising would lead to metabolite peak height distortion. Instead of optimizing this trade-off; denoising parameters were chosen that were close to previously know parameters that performed well.

TABLE 1

Comparison of SNR and metabolite peak ratios for normal vs. compressed sensing phantom data:

| | Peak SNR | Ala/Lac Ratio | Pyr/Lac Ratio | Pyr-H$_2$O/lac Ratio |
|---|---|---|---|---|
| Normal 16 × 8 | 63.2 | 0.549 | 0.462 | 0.427 |
| Compressed Sensing 16 × 8 | 64.8 | 0.547 | 0.467 | 0.405 |

Figure 6A:
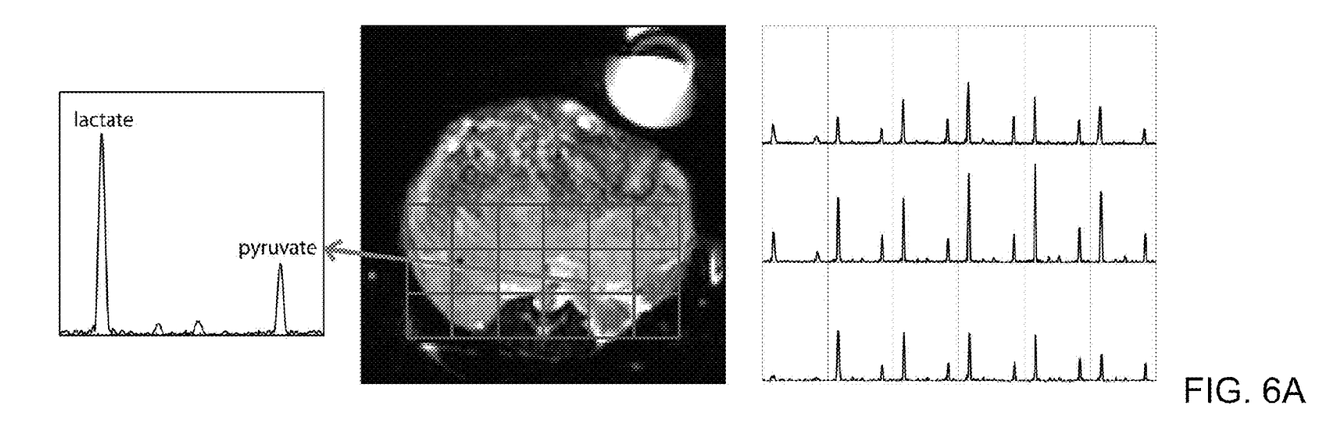
FIGS. 6A-B show a comparison of 8×8 mouse tumor data from a conventional scan and data from the same mouse acquired ~2 hours later with a 16×8 compressed sensing acquisition.
Figure 6B:
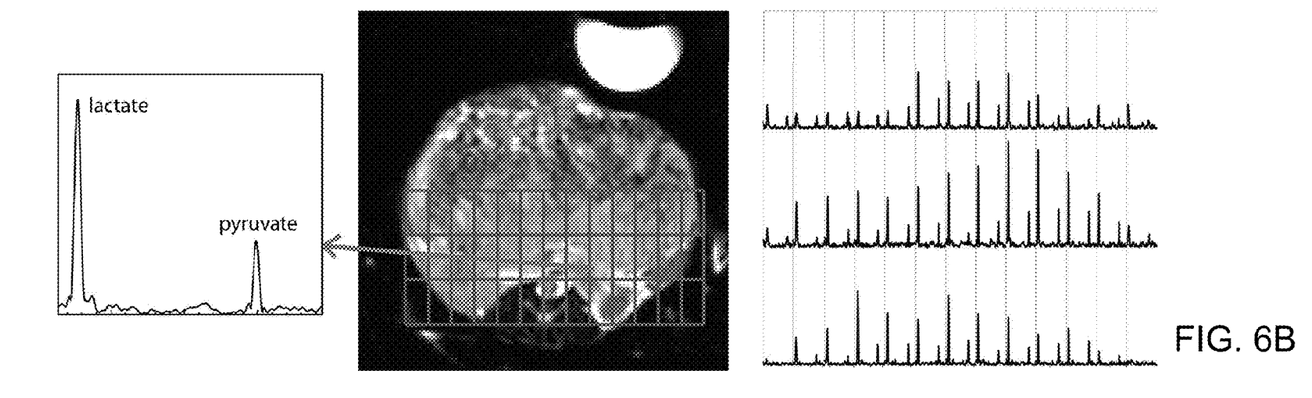

Mouse: FIGS. 6A-B show a comparison of 8×8 mouse tumor data from a conventional scan, FIG. 6A, and data from the same mouse acquired ~2 hours later with a 16×8 compressed sensing acquisition, FIG. 6B. For FIGS. 6A-B, the graphs on the left show the spectrum with the highest lactate peak, the middle images show the T2-weighted anatomical image, and the right graphs show spectra highlighted in the anatomical image. Qualitatively, the two sets of data appear similar, both showing elevated lactate characteristic of cancer tissue in the TRAMP model. One difference is that due to lower starting SNR, residual coherent aliasing, and the sparsifying effect of the $L_1$ reconstruction, the 16×8 mouse data do not show tiny peaks such as the alanine and pyruvate-$H_2O$ bumps seen in the single spectrum of FIG. 6A. Table 2 gives a quantitative comparison of the two reconstructions, showing SNR and lactate to pyruvate peak ratios. Halving the voxel size would normally reduce SNR by a factor of 2, but due to $L_1$ denoising and apodization, the final SNR for the 16×8 data was only 20% lower than that of the 8×8. Finally, as shown in Table 2, the ratios and standard deviations of the ratios match up reasonably well, especially considering the different voxel sizes and the two-hour interval between experiments.

TABLE 2

Comparison of SNR and metabolite peak ratios for normal vs. CS mouse data.

|  | Peak SNR | Lac/Pyr Ratio | Standard Deviation of Lac/Pyr Ratio |
| --- | --- | --- | --- |
| Normal 8 × 8 | 133.9 | 2.44 | 0.432 (n = 16 voxels) |
| Compressed Sensing 16 × 8 | 107.4 | 2.51 | 0.558 (n = 14 voxels) |

Other Embodiments: Although the parameters controlling the level of denoising, and thus the final SNR, were chosen manually in the previous embodiment such that values yielded high consistency to the acquired data, in other embodiments of the invention, an automatic parameter choice scheme is used. Other embodiments may employ more of the techniques in M. Lustig, D. L. Donoho, J. M. Pauly, "Sparse MRI: the application of compressed sensing for rapid MR imaging," Magn. Reson. Med. 58 (2007) 1182-1195, such as phase estimation and variable density sampling patterns, and it should be possible to perform more denoising and recover a higher SNR without sacrificing data fidelity. Employing a variable density trajectory has the added benefit of higher starting SNR because most of the signal energy resides in the center of k-space. In addition, in other embodiments of the invention, different wavelet sparsifying transforms could yield further performance enhancements. Finally, a sampling pattern in which $k_f$, $k_x$, and $k_y$ are undersampled could provide a substantial performance gain by exploiting 3D sparsity and spreading aliasing into three dimensions, thus producing more incoherent aliasing.

Figure 7:
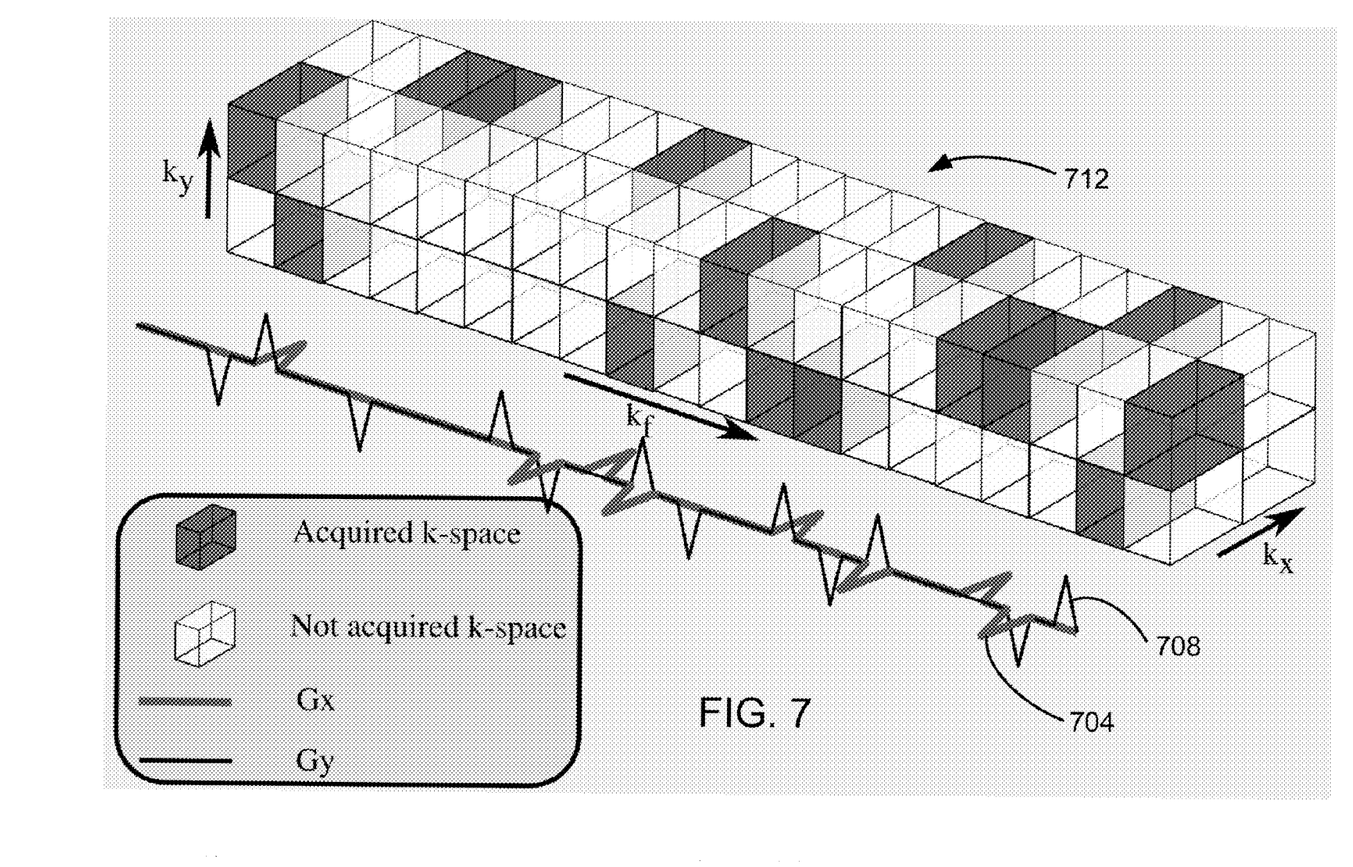
FIG. 7 illustrates the waveform modifications necessary to achieve a 3D design, namely the addition of y gradient blips.

FIG. 7 illustrates the waveform modifications necessary, in an embodiment of the invention, to achieve a 3D design, namely the addition of y gradient blips. Blips in the $G_R$ direction are shown by the thicker line 704. Blips in the $G_y$ direction are shown by the thinner line 708, which shows the gradient waveforms and corresponding k-space sampling 712. This 3D embodiment provides a 4-fold acceleration design. Note that the scheme of using both x and y blips at the same time is merely one way to implement the 3D design. Another embodiment keeps the x blip scheme of FIG. 4A but generates different blip patterns (as in FIG. 4B) for different y phase encodes, effectively creating a pseudo-random 3D k-space sampling pattern. Based on the results shown for the 2D design, it is believed that there would be no obstacles in the 3D extension. With all the abovementioned embodiments, much higher rates of acceleration might be obtainable. Other embodiments focus on designing experiments to verify metabolite ratio performance in mice or other animals.

Key to the design was the exploitation of sparsity in hyperpolarized spectra and an implementation that used blips to undersample in $k_f$ and $k_x$. Phantom experiments showed low SNR loss while preserving accuracy of metabolite peak ratios, and mouse trials demonstrated the in-vivo feasibility of improving spatial resolution without increasing scan time in hyperpolarized $^{13}C$ flyback 3D-MRSI.

Flow Chart

Figure 8:
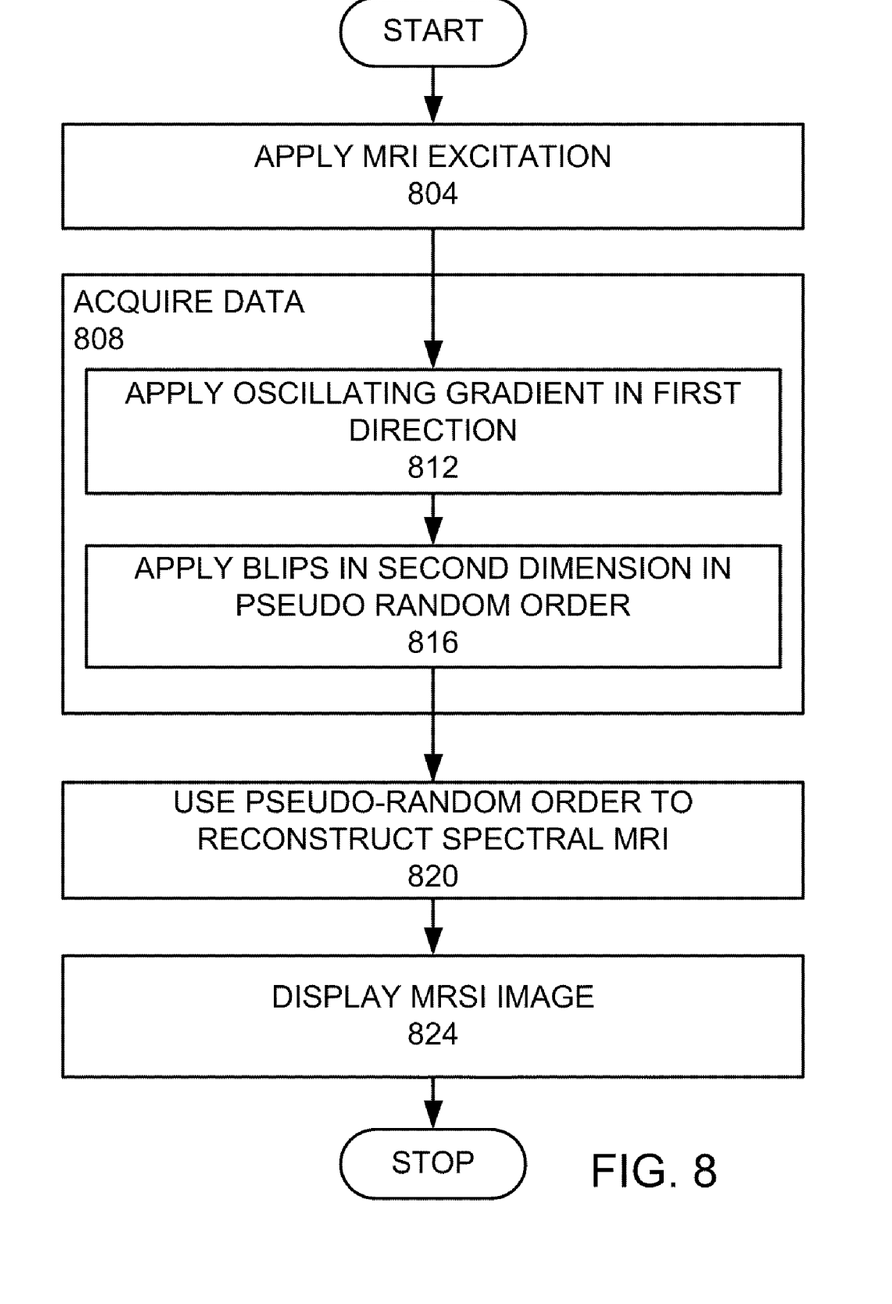
FIG. 8 is a high level flow chart of an embodiment of the invention.

FIG. 8 is a high level flow chart of an embodiment of the invention. A magnetic resonance imaging (MRI) excitation is applied (step 804). Data is acquired (step 808). Acquiring data comprises applying an oscillating gradient in a first direction (step 812). Blips are applied in at least a second dimension in a pseudo-random order (step 816). The pseudo-random blips allow temporally undersampled spectral data in at least two planes. The pseudo-random order is used to reconstruct a magnetic resonance spectral image in at least two dimensions (step 820). The magnetic resonance spectral image is displayed (step 824).

Figure 9:
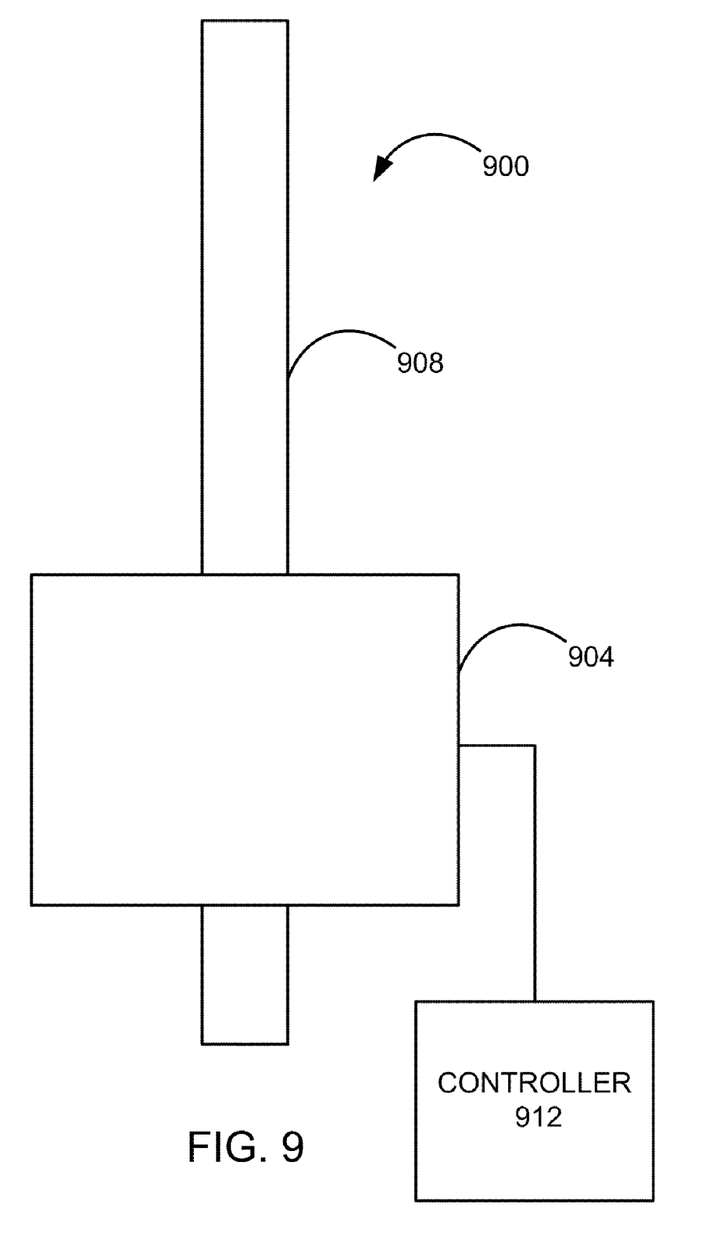
FIG. 9 is a schematic top view of a magnetic resonance imaging (MRI) system.

FIG. 9 is a schematic top view of a magnetic resonance imaging (MRI) system 900 that may be used in an embodiment of the invention. The MRI system 900 comprises a magnet system 904, a patient transport table 908 connected to the magnet system, and a controller 912 controllably connected to the magnet system. In one example, a patient would lie on the patient transport table 908 and the magnet system 904 would pass around the patient. The controller 912 would control magnetic fields and radio frequency (RF) signals provided by the magnet system 904 and would receive signals from detectors in the magnet system 904. In this example, the magnet system would comprise a plurality of coils for parallel imaging.

Figure 10A:
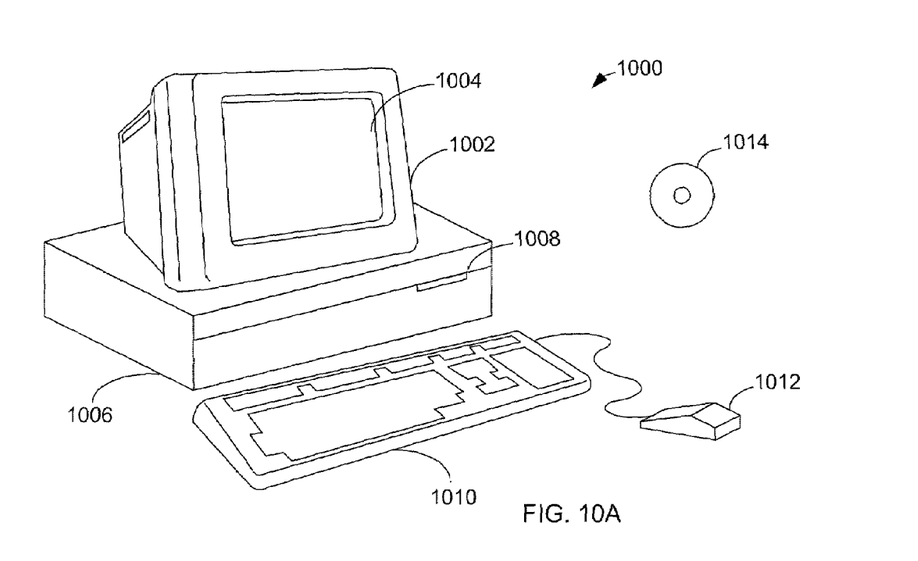
FIGS. 10A-B illustrate a computer system, which is suitable for implementing a controller used in embodiments of the present invention.
Figure 10B:
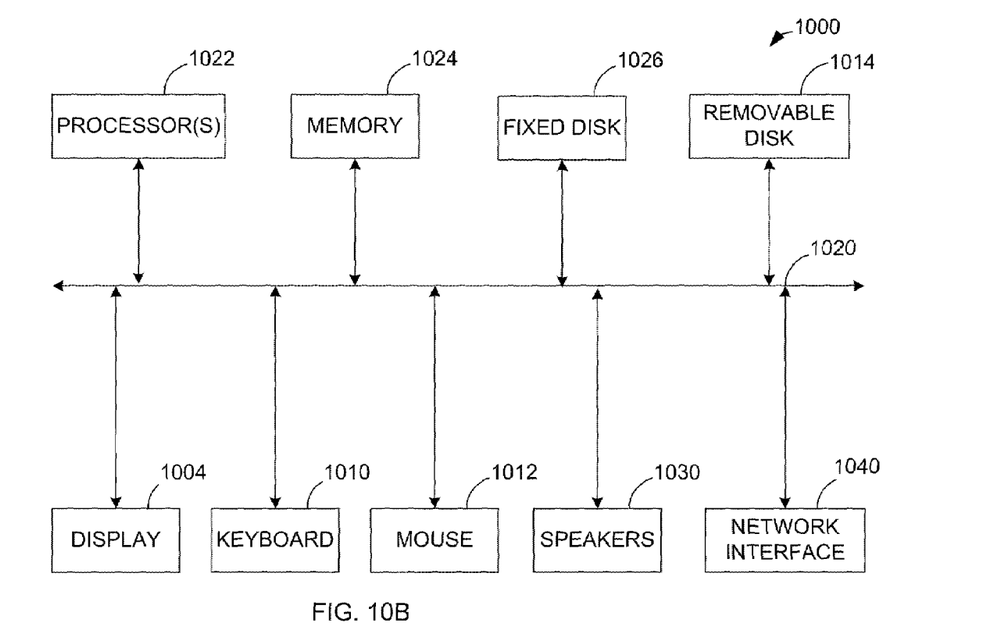

FIGS. 10A and 10B illustrate a computer system 1000, which is suitable for implementing a controller 912 used in embodiments of the present invention. FIG. 10A shows one possible physical form of the computer system. Of course, the computer system may have many physical forms ranging from an integrated circuit, a printed circuit board, and a small handheld device up to a huge super computer. Computer system 1000 includes a monitor 1002, a display 1004, a housing 1006, a disk drive 1008, a keyboard 1010, and a mouse 1012. Disk 1014 is a computer-readable medium used to transfer data to and from computer system 1000.

FIG. 10B is an example of a block diagram for computer system 1000. Attached to system bus 1020 are a wide variety of subsystems. Processor(s) 1022 (also referred to as central processing units, or CPUs) are coupled to storage devices, including memory 1024. Memory 1024 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1026 is also coupled bi-directionally to CPU 1022; it provides additional data storage capacity and may also include any of the computer-readable media described below. Fixed disk 1026 may be used to store programs, data, and the like and is typically a secondary storage medium (such as a hard disk) that is slower than primary storage. It will be appreciated that the information retained within fixed disk 1026 may, in appropriate cases, be incorporated in standard fashion as virtual memory in memory 1024. Removable disk 1014 may take the form of the computer-readable media described below.

CPU 1022 is also coupled to a variety of input/output devices, such as display 1004, keyboard 1010, mouse 1012, and speakers 1030. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1022 optionally may be coupled to another computer or telecommunications network using network interface 1040. With such a network interface, it is contemplated that the CPU might receive information from the network, or might output information to the network in the course of performing the above-described method steps. Furthermore, method embodiments of the present invention may execute solely upon CPU 1022 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of providing a magnetic resonance spectral image (MRSI), comprising:
   a) applying a magnetic resonance imaging excitation;
   b) acquiring data, comprising:
      applying an oscillating gradient in a first dimension, and
      applying blips in at least a second dimension in a pseudo-random order to acquire pseudo-random temporally undersampled spectral data in at least two planes; and
   c) using the pseudo-random order to reconstruct a magnetic resonance spectral image in at least two dimensions.

2. The method, as recited in claim 1, wherein the magnetic resonance spectral image is in three dimensions.

3. The method, as recited in claim 2, wherein the acquiring data uses flyback readouts.

4. The method, as recited in claim 3, wherein the applying pseudo-random blips applies blips in a third dimension to acquire temporally undersampled spectral data in at least four planes.

5. The method, as recited in claim 4, wherein the magnetic resonance spectral image in at least two dimensions is a hyperpolarized image.

6. The method of claim 5, wherein the magnetic resonance spectral image in at least two dimensions is a $^{13}$C 3D hyperpolarized image.

7. The method, as recited in claim 6, wherein sampling time is reduced by a factor of at least 2.

8. The method, as recited in claim 7, wherein the acquiring data uses a spin-echo sequence.

9. The method of claim 1 where the reconstruction uses the equation Minimize $\|W g\|_1$ s.t. $\|F_k g - y\|_2 < \epsilon$.

10. The method, as recited in claim 1, wherein the acquiring data uses flyback readouts.

11. The method, as recited in claim 1, wherein the applying pseudo-random blips applies blips in a third dimension to acquire temporally undersampled spectral data in at least four planes.

12. The method, as recited in claim 1, wherein the magnetic resonance spectral image in at least two dimensions is a hyperpolarized image.

13. The method of claim 1, wherein the magnetic resonance spectral image in at least two dimensions is a $^{13}$C 3D hyperpolarized image.

14. The method, as recited in claim 1, wherein sampling time is reduced by a factor of at least 2.

15. The method, as recited in claim 1, wherein the acquiring data uses a spin-echo sequence.

16. The method, as recited in claim 1, further comprising displaying the reconstructed image.

17. An apparatus for providing a magnetic resonance spectral imaging (MRSI), comprising:
   a magnetic resonance imaging excitation and detection system; and
   a controller electrically connected to the magnetic resonance imaging excitation and detection system, comprising:
      a display;
      at least one processor; and
      computer readable media, comprising:
         computer readable code for applying a magnetic resonance imaging excitation;
         computer readable code for acquiring data, comprising:
            computer readable code for applying an oscillating gradient in a first dimension, and
            computer readable code for applying blips in at least a second dimension in a pseudo-random order to acquire pseudo-random temporally undersampled spectral data in at least two planes;
         computer readable code for using the pseudo-random order to reconstruct a magnetic resonance spectral image in at least two dimensions; and
         computer readable code for displaying the image on the display.

* * * * *

UNITED STATES PATENT AND TRADEMARK OFFICE
CERTIFICATE OF CORRECTION

| | | |
|---|---|---|
| PATENT NO. | : 7,659,718 B1 | Page 1 of 1 |
| APPLICATION NO. | : 12/183391 | |
| DATED | : February 9, 2010 | |
| INVENTOR(S) | : Lustig et al. | |

It is certified that error appears in the above-identified patent and that said Letters Patent is hereby corrected as shown below:

Column 1:

• Please replace lines 8-10 with:

--This invention was made with Government support under contract EB007588 awarded by the National Institutes of Health. The Government has certain rights in this invention.--

Signed and Sealed this
Fifth Day of April, 2011

David J. Kappos
*Director of the United States Patent and Trademark Office*